(12) United States Patent
Runze

(10) Patent No.: US 7,565,389 B2
(45) Date of Patent: Jul. 21, 2009

(54) METHOD FOR DETERMINING FILTER COEFFICIENTS OF A DIGITAL FILTER AND DIGITAL FILTER

(75) Inventor: Gerhard Runze, Oberasbach (DE)

(73) Assignee: NXP B.V., Eindhoven (NL)

( * ) Notice: Subject to any disclaimer, the term of this patent is extended or adjusted under 35 U.S.C. 154(b) by 748 days.

(21) Appl. No.: 10/532,903

(22) PCT Filed: Oct. 20, 2003

(86) PCT No.: PCT/IB03/04685

§ 371 (c)(1),
(2), (4) Date: Apr. 27, 2005

(87) PCT Pub. No.: WO2004/040757

PCT Pub. Date: May 13, 2004

(65) Prior Publication Data

US 2005/0289201 A1 Dec. 29, 2005

(30) Foreign Application Priority Data

Oct. 30, 2002 (DE) ................. 102 50 555

(51) Int. Cl.
  *G06F 17/10* (2006.01)
(52) U.S. Cl. ..................................... 708/319
(58) Field of Classification Search ................... 708/319
  See application file for complete search history.

(56) References Cited

U.S. PATENT DOCUMENTS

| 4,791,597 | A |   | 12/1988 | Miron et al. |
| 5,548,540 | A | * | 8/1996 | Staver et al. ................. 708/313 |
| 5,732,004 | A |   | 3/1998 | Brown |
| 5,831,880 | A | * | 11/1998 | Lee ............................ 708/319 |
| 6,243,729 | B1 | * | 6/2001 | Staszewski .................. 708/319 |
| 6,311,203 | B1 |   | 10/2001 | Wada et al. |
| 6,505,221 | B1 | * | 1/2003 | Maschmann ................. 708/306 |

FOREIGN PATENT DOCUMENTS

| EP | 0766388 A2 | 4/1997 |
| EP | 0766388 B1 | 4/1997 |
| WO | WO0122582 A1 | 3/2001 |

OTHER PUBLICATIONS

Henry Samueli; An Improved Search Algorithm for the Design of Multiplierless Coefficients; vol. 36; No. 7; Jul. 1, 1989; pp. 1044-1047; New York, US.

* cited by examiner

*Primary Examiner*—David H Malzahn
(74) *Attorney, Agent, or Firm*—Lisa K. Jorgenson; Robert Iannucci; Seed IP Law Group PLLC

(57) ABSTRACT

In a method for determining filter coefficients of a digital filter, particularly in UMTS, the predetermined filter coefficients bv are divided by a same scaling factor s and then quantized in that counted from the most significant bit onwards only a certain number n of "1" bits is used and in that the quantization error E(s) is minimized by the selection of the scaling factor s0 and these scaled and quantized filter coefficients βv are implemented in the filter.

19 Claims, 13 Drawing Sheets

Figure 1:
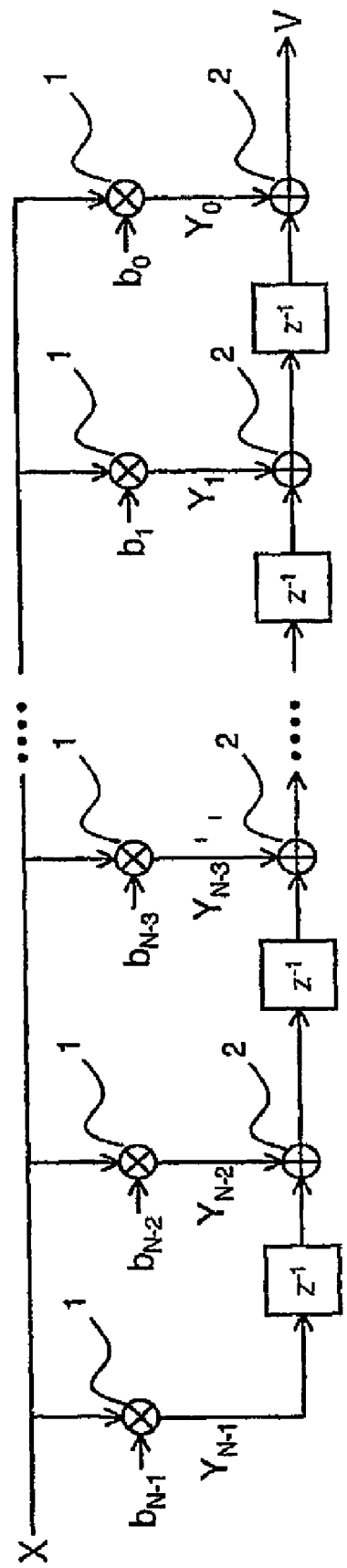

METHOD FOR DETERMINING FILTER COEFFICIENTS OF A DIGITAL FILTER AND DIGITAL FILTER

The invention relates to a method for modifying filter coefficients for a digital filter, more particularly for UMTS (Universal Mobile Telecommunication System), in which the filter coefficients are predetermined and modified in a filter design program. Furthermore, the invention relates to a digital filter of this type.

Digital filters are used, for example, as pulse shaping filters and matched filters in the UMTS standard (3GPP, TS 25.201: UE Radio Transmission and Reception (FDD), V3.2.0) and (3GPP, TS 25.213: Spreading and Modulation (FDD), V3.0.0). Owing to the number of filter coefficients to be processed and the large signal bandwidth such filters require much computation circuitry. Therefore, they can hardly be implemented by a signal processor which is part of the appliance that has the filter function. A hardware implementation necessary as a result and having its own components (chips) for the filters leads to much surface area in the appliance and to increased energy consumption. These two elements are thwarting a compact construction of the appliance.

In U.S. Pat. No. 6,311,203 is described a digital filter in which two factors are multiplied by to simplify the calculation of the filter coefficients. A preselection of filter coefficients that can be evaluated in a simple manner is not provided.

In U.S. Pat. No. 5,732,004 scaling factors are assigned to individual filter coefficients. A common scaling factor for all the filter coefficients is not provided.

From WO 01/22 582 A1 is known a floating point FIR filter. A common scaling factor is not provided.

It is an object of the invention to provide a method and a filter of the type defined in the opening paragraph in which without a decisive deterioration of the filter properties and of the processing rate, the filter is produced with a small chip surface and little current consumption.

The above object with respect to the method is achieved by the characteristic features of the present invention and with respect to the characteristic features of a filter according to the present invention.

For this purpose, the ideal filter coefficients previously determined in a filter design program are quantized and scaled so that they can be processed by a simple adding operation and costly multipliers are avoided. The filter coefficients simplified by quantization and scaling are not determined in the respective appliance that comprises the filter function. They are determined from the ideal filter coefficients in an extended filter design program and subsequently implemented in the appliance.

The quantized and scaled filter coefficients simplify the numerical complexity of the computation of the filtered signal. This allows to realize the filter function that has a small required area or space in the appliance and with little energy consumption. The filter may be an up-link and/or down-link, root-raised cosine filter of the UMTS with fixed-point arithmetic. The described measures, however, may also be used in other non-recursive filters working with fixed-point arithmetic.

Figure 2:
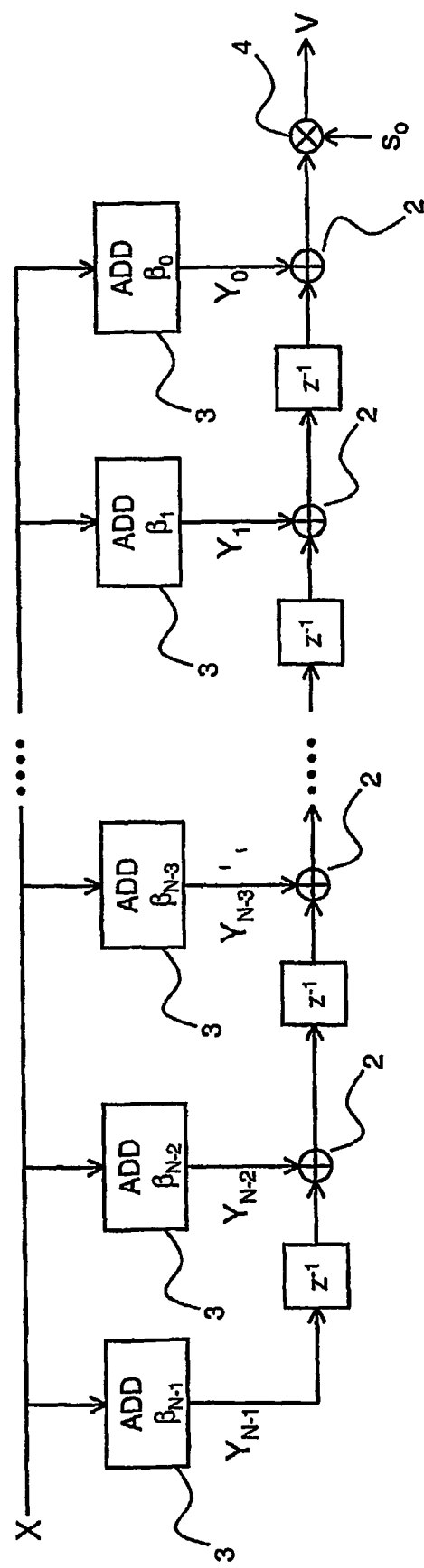
Figure 3:
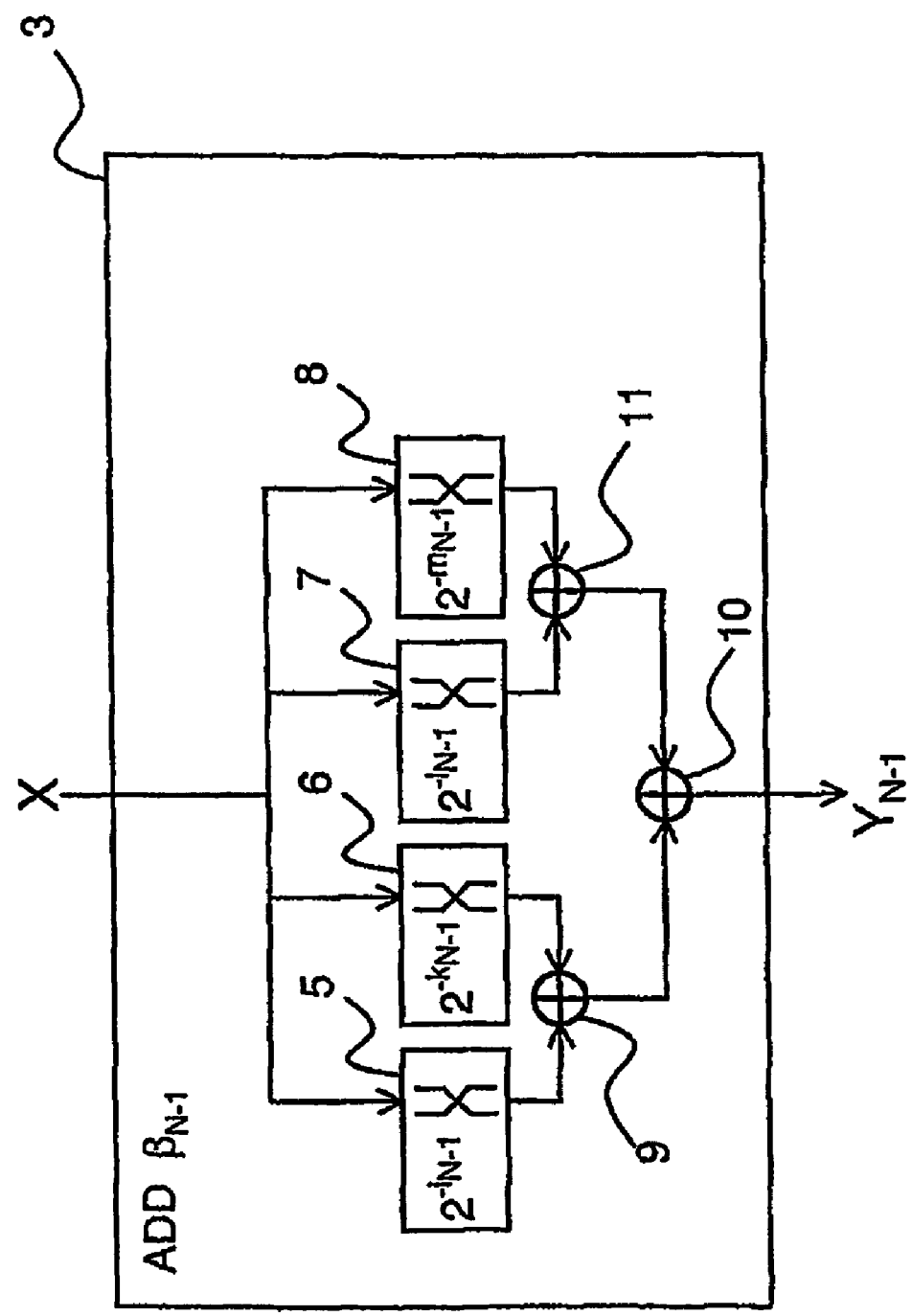
Figure 4:
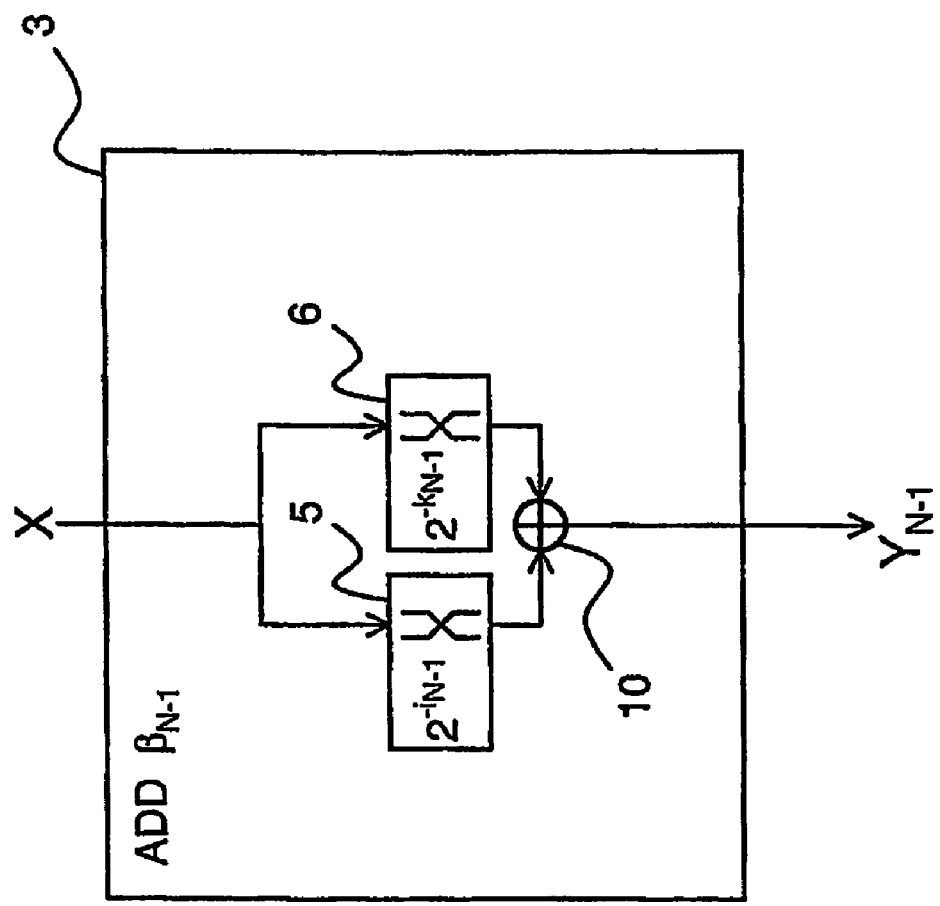
Figure 5:
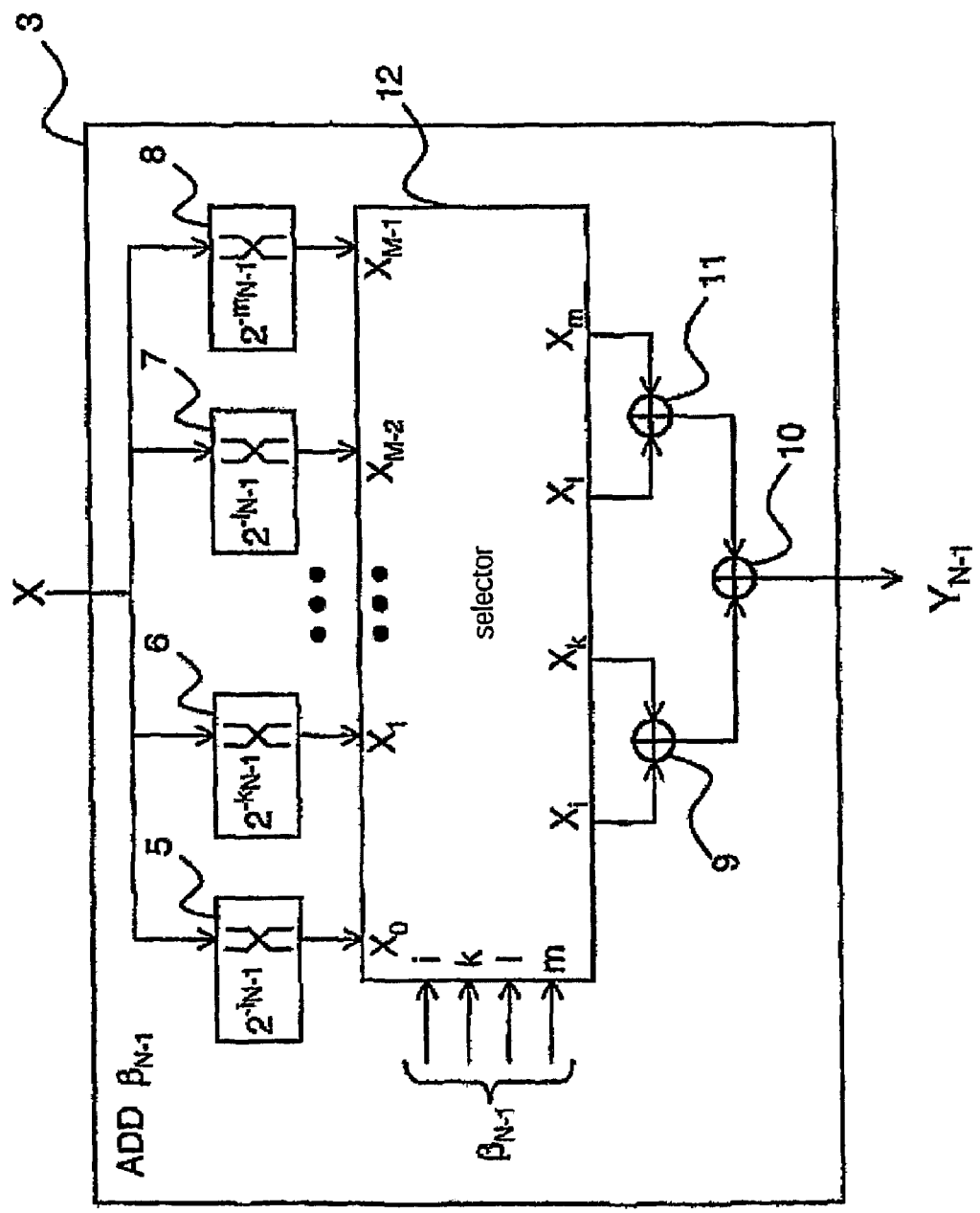
Figure 6:
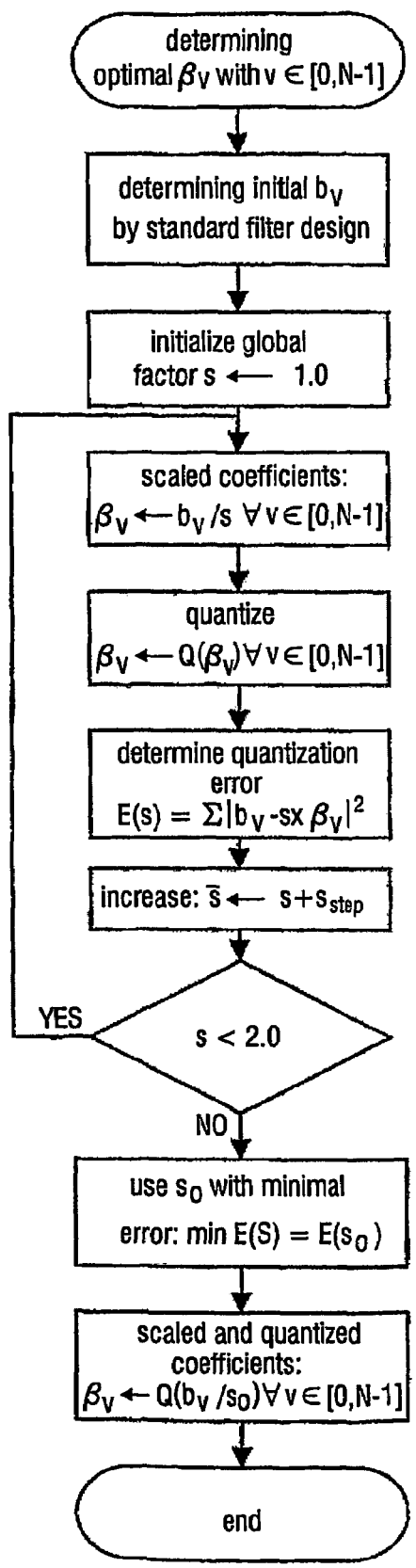
Figure 7:
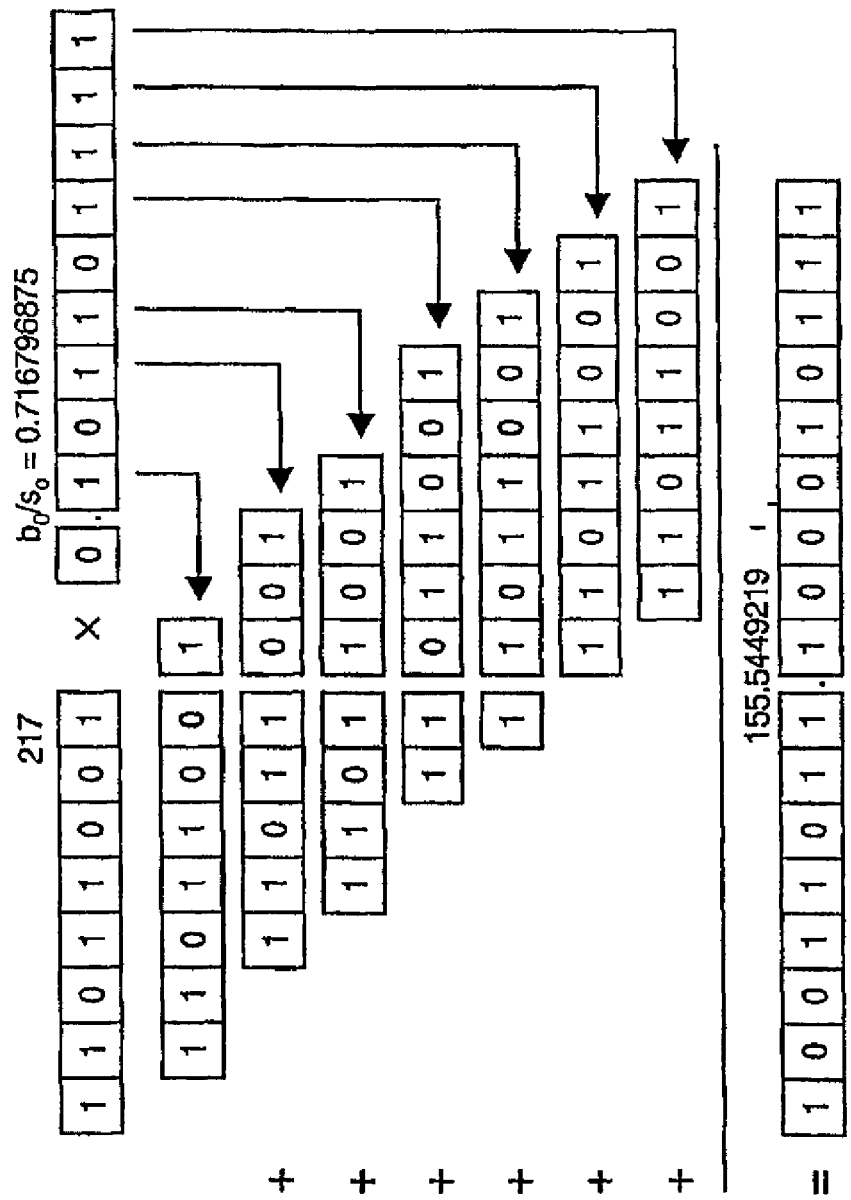
Figure 8:
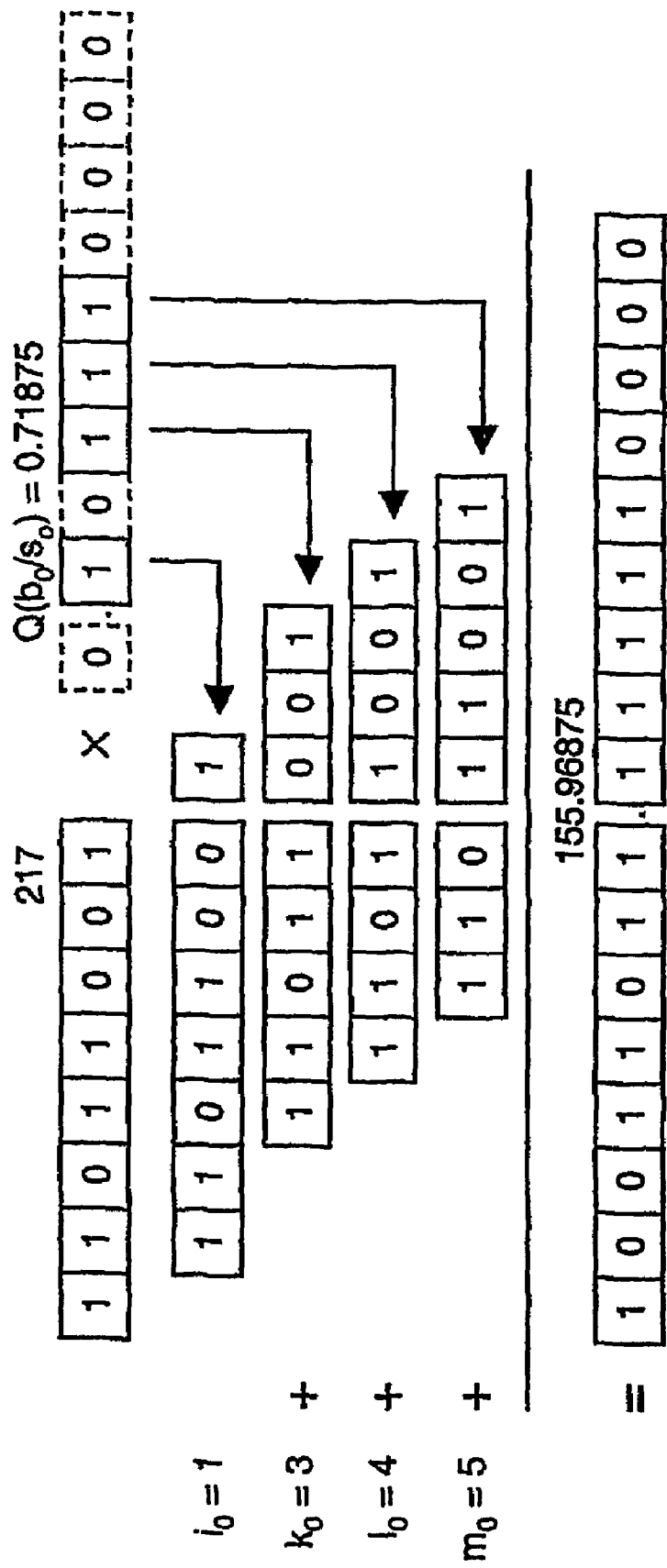
Figure 9:
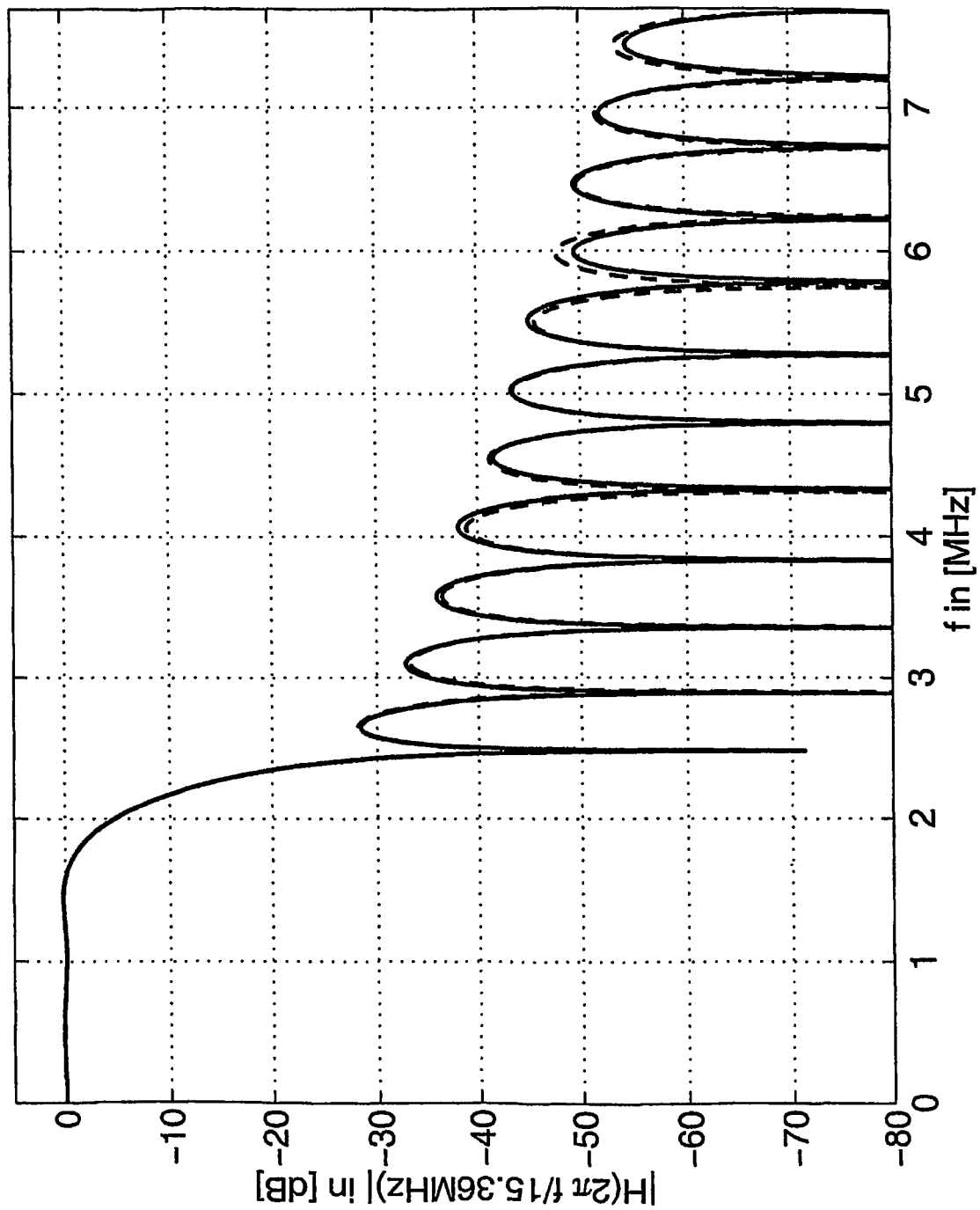
Figure 10:
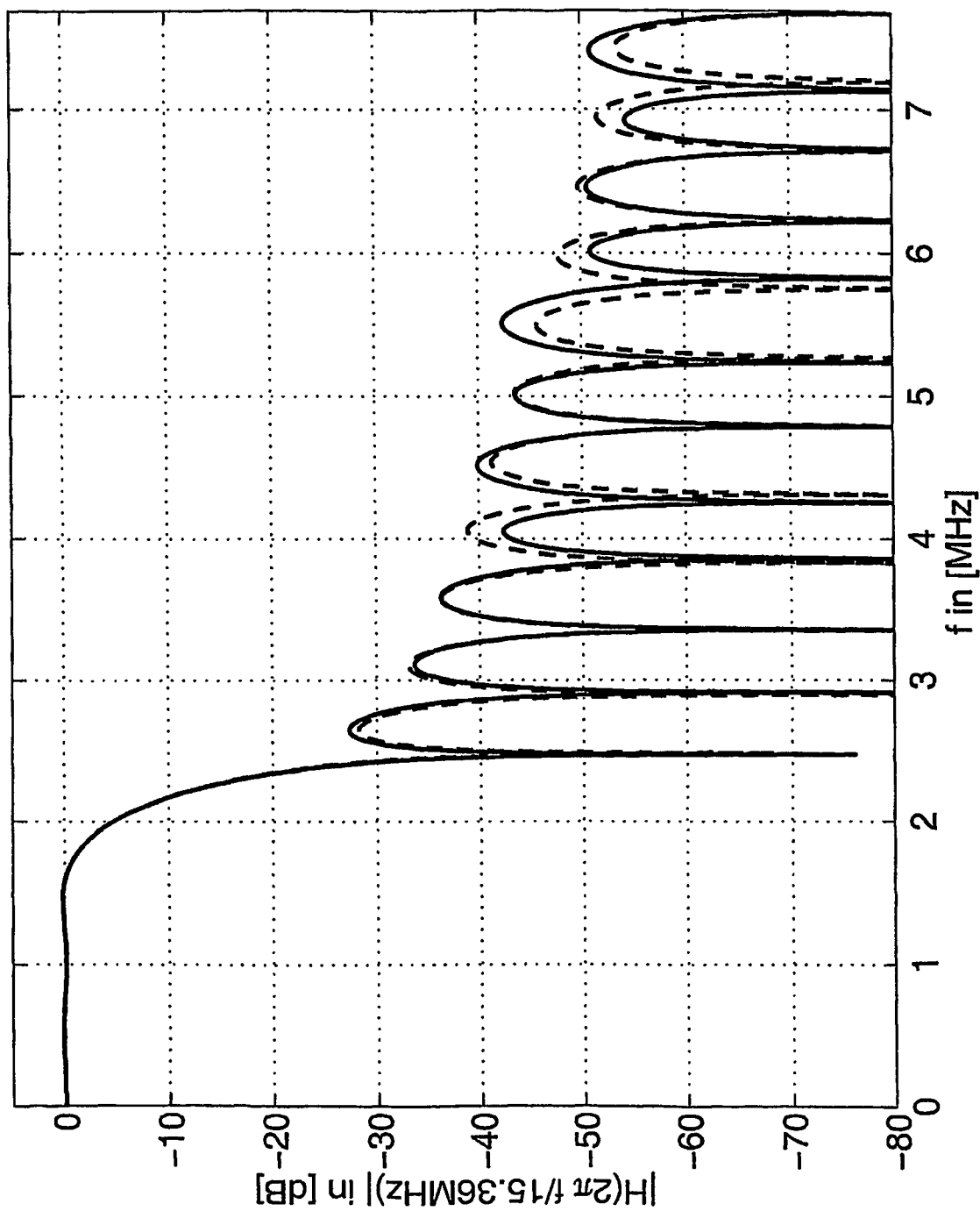
Figure 11:
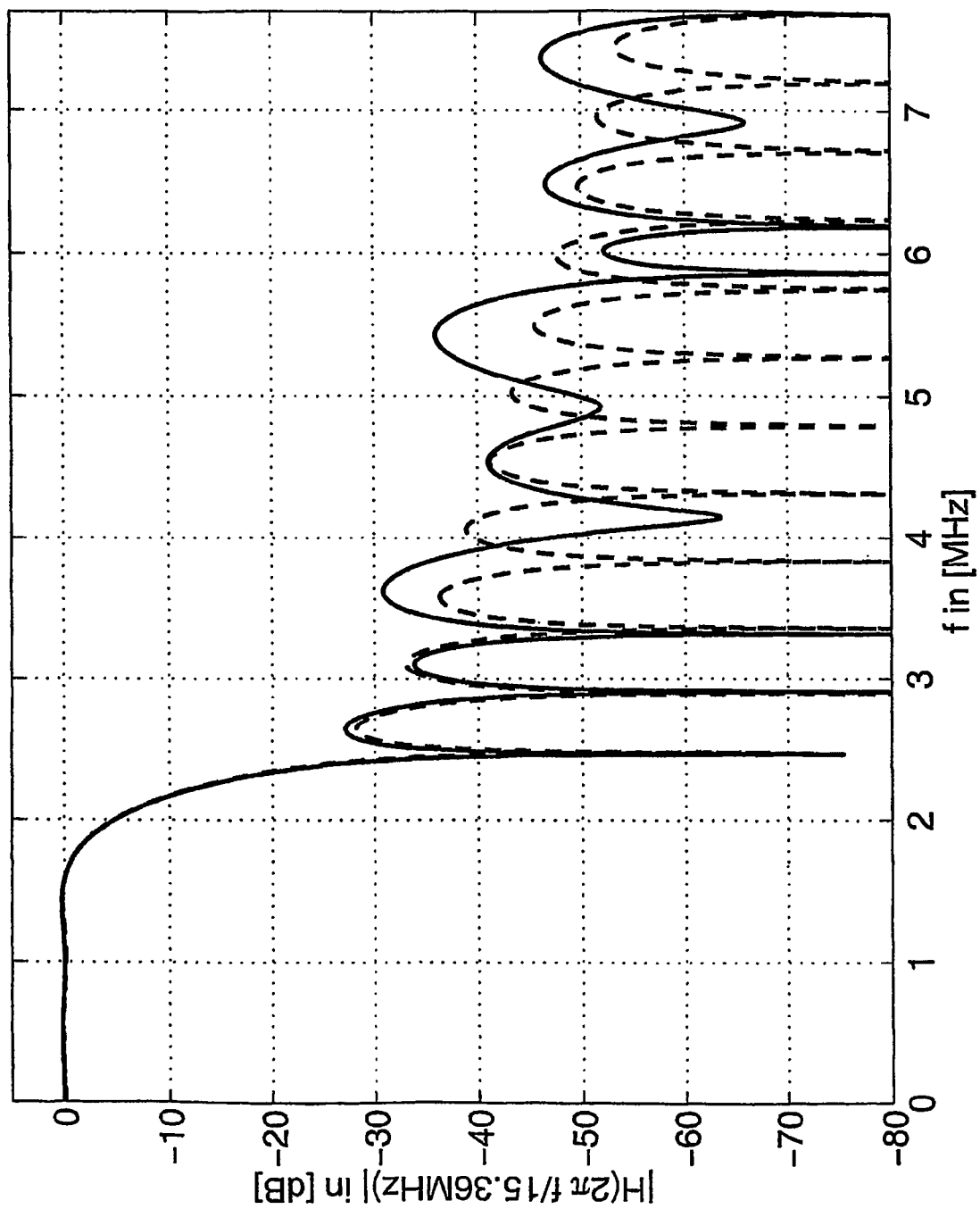
Figure 12:
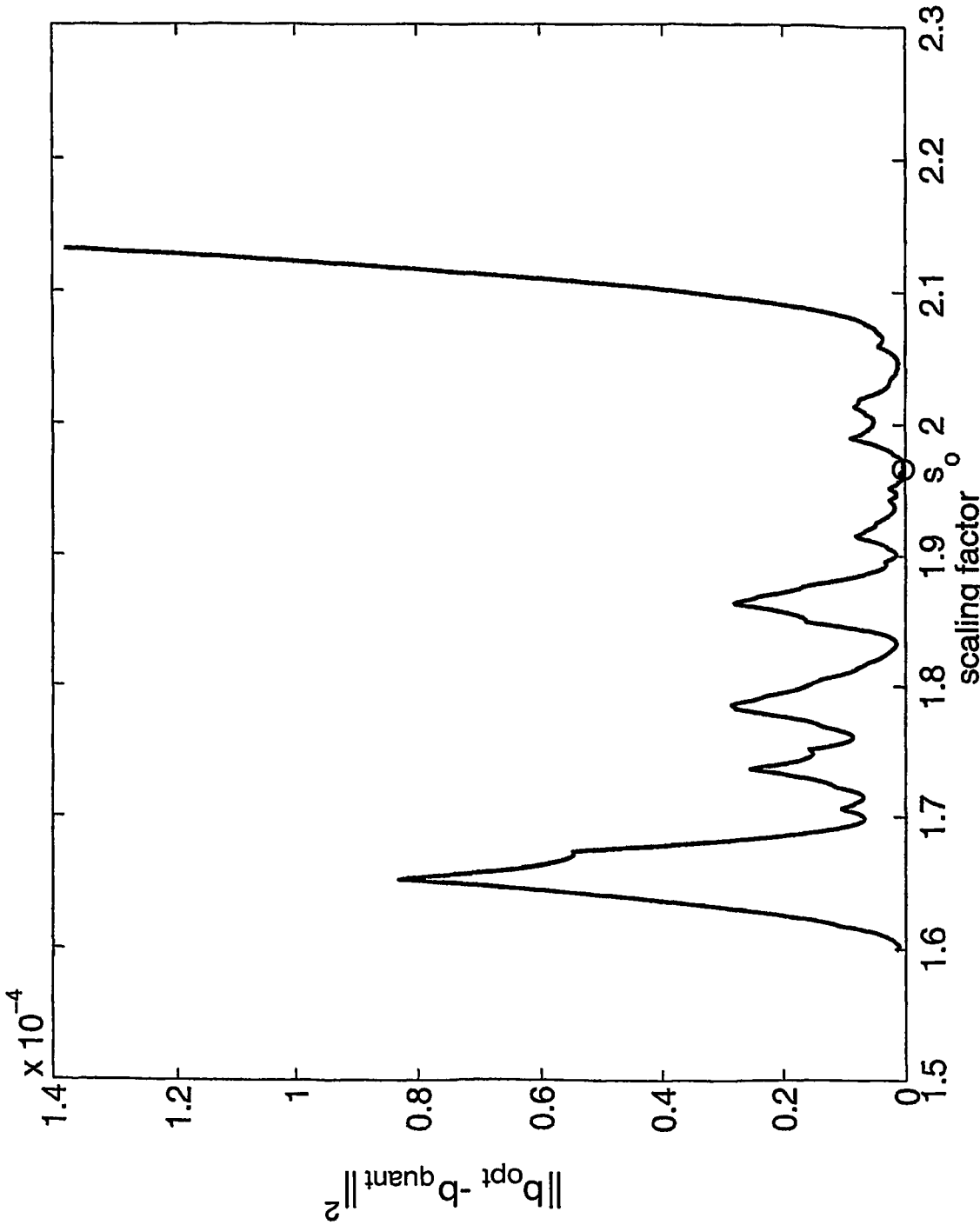
Figure 13:
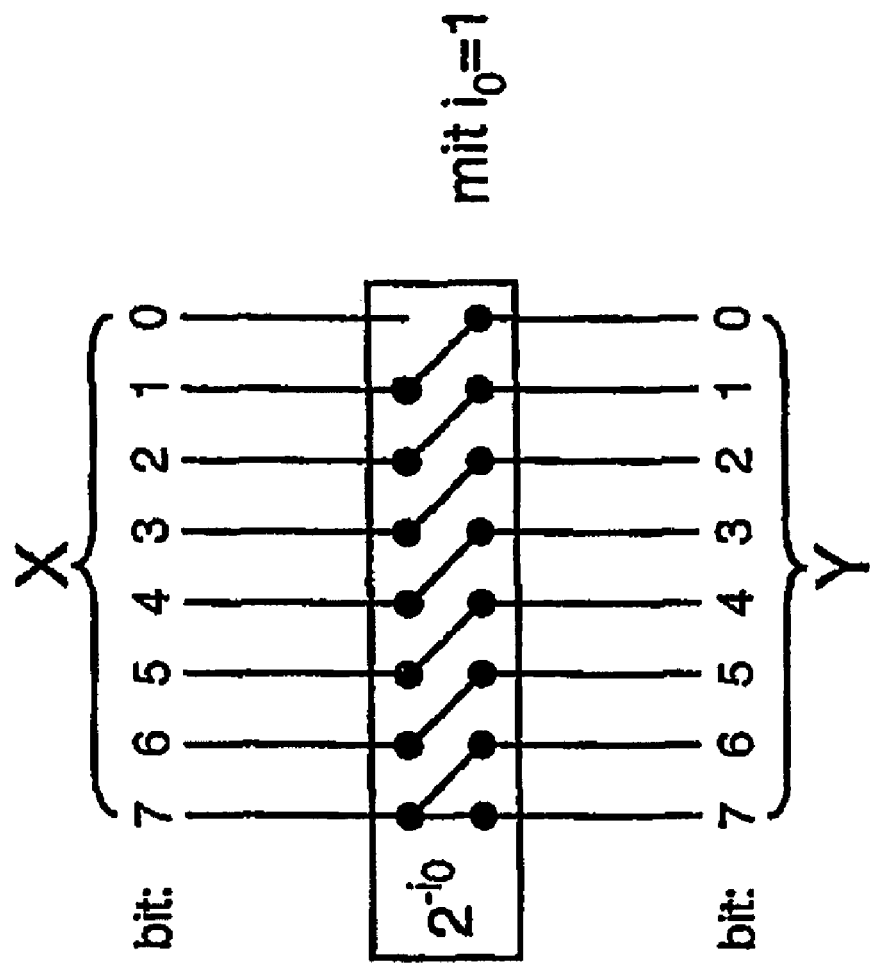
Figure 13:
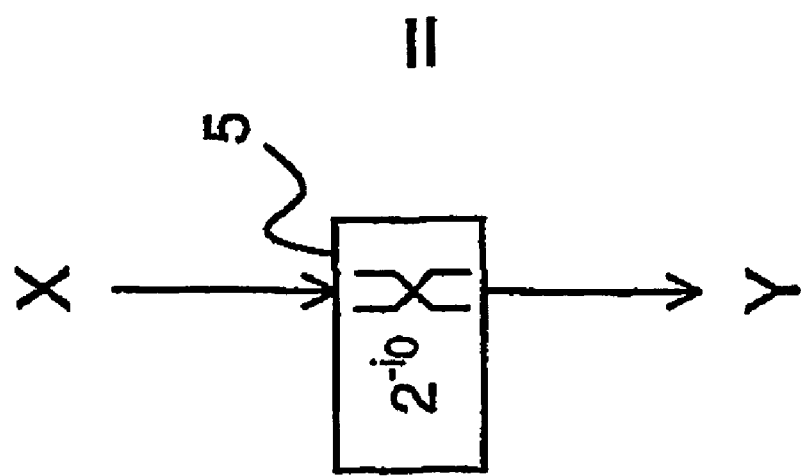

Advantageous embodiments of the invention are apparent from the following description of the present invention. In the drawing:

FIG. 1 shows a FIR filter according to the state of the art,
FIG. 2 shows an improved filter arrangement with adder stages for the filter coefficients,
FIG. 3 shows one of the adder stages with three adders,
FIG. 4 alternatively shows an adder stage with one adder,
FIG. 5 alternatively shows an adder stage with selectable filter coefficients,
FIG. 6 shows a flow chart of the determination of the filter coefficients,
FIG. 7 shows a computation scheme for the multiplication by filter coefficients according to the state of the art,
FIG. 8 shows a computation scheme for the multiplication by a quantized filter coefficient,
FIG. 9 shows the quantity response for the evaluation of 4 "1" bits per coefficient,
FIG. 10 shows the quantity response for an evaluation of 3 "1" bits per coefficient,
FIG. 11 shows the quantity response for the evaluation of 2 "1" bits per coefficient,
FIG. 12 shows the quantization error in scaling factors between 1.5 and 2.3, and
FIG. 13 shows a multiplier for the multiplication by squares.

In prior-art filters (FIG. 1) an input signal X is multiplied by filter coefficients $b_{N-1}$ to $b_0$ in a plurality of multipliers 1. The filter coefficients are predetermined by means of a filter design program corresponding to the desired type of filter. The resulting partial signals $Y_{N-1}$ to $Y_0$ are summed by adders 2 in a time-delayed manner ($z^{-1}$), the sum denoting the filtered output signal V. The ideal frequency response is shown in a dashed line in the FIGS. 9 to 12 for a Root-Raised Cosine Filter. FIG. 7 shows an example for a multiplication according to the state of the art in which it is assumed that the signal value is decimal 217, thus 11011001 in binary form and the filter coefficient decimal 0.716796875 is 0.101101111 in binary form. For a random coefficient with nine binary fractional digits, eight computation steps are necessary. This leads to a high filter complexity.

In the described filter, coefficients which are simplified by scaling and quantization are used which can be processed in a simpler manner. The flow chart of FIG. 6 diagrammatically shows how new filter coefficients $\beta_\nu$ are formed from the predetermined filter coefficients $b_\nu$. This is effected prior to the implementation of the filter coefficients in the filter.

Once the filter coefficients $b_\nu$ typically of a filter have first been determined by a standard filter design, they are divided by a scaling factor which is the same for all the filter coefficients. The result is the scaled filter coefficients $\beta_\nu = b_\nu/s$.

Subsequently, a quantization of the scaled filter coefficients takes place. During the quantization the number n of the "1" bits found after the most significant bit (MSB) is limited to a certain maximum number n, where n is 4, 3 or 2 in the examples described. The number n may be different for each adder stage depending on the coefficients provided. This is based on the recognition that a multiplication of a signal value by a filter coefficient having few "1" bits needs fewer adding operations than a multiplication by an arbitrary filter coefficient of a same effective word length.

As a result of the quantization, distortions of the filtered signal will inevitably occur. This quantization error is smallest possible.

After the quantization the respective quantization error:

$$E(s) = \Sigma |b_\nu - s \times \beta_\nu|^2$$

is determined (compare FIG. 6) and stored. Then the scaling factor s which was, for example, 1.0 is increased by one step ($s_{step}$) and the quantization error occurring with this new scaling factor is again determined and stored. If then the scaling factor increased in steps exceeds 2.0, a comparison is made what scaling factor $s_0$ leads to a minimum quantization error. This scaling factor $s_0$ is then used for the final determination of the filter coefficient $\beta_\nu$ found via scaling and quantization, where $$\beta_\nu = Q(b_\nu/s_0)$$

Q then describes the quantization.

At the output of the filter the division of the original filter coefficient by the common value $s_0$ is canceled as a result of a multiplication by the common scaling factor $s_0$.

The following Table shows stages of the quantization algorithm in the light of a numerical example:

| Stage | Binary | Decimal | quantization error |
|---|---|---|---|
| original value | 0.101101111 | 0.716796875 | — |
| step 1:4 "1" bits | 0.101101 | 0.703125 | 0.013671875 |
| consider next bit | 0.1011011 | 0.7109375 | 0.005859375 |
| round at fourth "1" bit | 0.101110 | 0.71875 | 0.00195125 |

In the Table it is assumed that the number n of "1" bits allowed after the most significant bit is n=4.

As appears from the Table the binary original value has seven "1" bits. In accordance with the guideline, in step 1 the binary value is limited to four "1" bits after the most significant bit, here 0. This corresponds to a decimal value of 0.703125, which as against the decimal original value means a quantization error of 0.013671875.

In a second step the next bit following the last "1" bit of step 1 is considered, which again is a "1" bit in the example. Since this bit is a "1" bit, a rounding is made in the next step, so that the binary value 0.1011110 arises. This corresponds to a decimal value 0.71875 which, compared to the decimal original value—irrespective of the scaling factor used—means a quantization error of −0.00195125. The rounding thus considerably reduces the quantization error.

FIG. 8 represents in comparison to FIG. 7 the computation scheme in which "217" is processed with said quantized and scaled filter factor in a decimal way: 0.71875 or binary way 0.101110, respectively. Based on the quantization scheme used the filter factor can be unambiguously described by the (maximum n) positions of all bits set to "1", in this case by the positions $i_0$, $k_0$, $l_0$ and $m_0$ having the values 1, 3, 4 and 5. This processing requires only four steps $i_0$, $k_0$, $l_0$, $m_0$. Each multiplication by this "1" corresponds to a shift of the input signal, here decimal: 217, binary 11011001. Accordingly, $i_0$ is a shift by one position, $k_0$ is a shift by three positions, $l_0$ a shift by four positions, $m_0$ a shift by five positions. Such shifts can be realized with little circuitry because only data lines need to be properly connected for this purpose, as is shown by FIG. 13 via a shift by one position.

As a result of the described quantization, the optimum scaling factor $s_0$ can be sought in a limited interval, for example, in the interval from 1 to 2 or in the interval from $\frac{1}{2}\sqrt{2}$ to $\sqrt{2}$.

Said filter coefficients $\beta_\nu$ allow a simplified filter structure or a simplified implementation of the filter, respectively, because multipliers are replaced by adders.

FIG. 2 schematically shows the structure of the filter. The multipliers 1 of FIG. 1 are replaced by adder stages ADD3 in which the scaled and quantized filter coefficients $\beta_\nu$, $\beta_{N-1}$ to $\beta_0$ respectively, are processed. In a final stage 4, which may be arranged as a multiplier, a sum signal is processed with a factor $s_0$ reciprocal to the scaling factor of the filter coefficient $1/s_0$, to do away with the effect the scaling factor has on the output signal V. The final stage 4 may be omitted if the absolute value does not play a decisive role.

FIG. 3 shows one of the adder stages ADD 3 for the filter coefficient $b_{N-1}$. FIG. 3 relates to the case where said number n=4, thus the filter coefficients are limited to four "1" bits per coefficient. Accordingly, four multipliers 5, 6, 7, 8 are provided which are designed for the multiplication by squares, that is, $-i_{N-1}$, $-k_{N-1}$, $-l_{N-1}$, $-m_{N-1}$ in accordance with the respective filter coefficient, while these powers correspond to the example $i_0$, $k_0$, $l_0$, $m_0$ of FIG. 8.

The result of the multipliers 5 and 6 is summed in an adder 9. The result of the multipliers 7 and 8 is summed in an adder 11. The results of the two adders are added in a further adder 10 to an intermediate signal $Y_{N-1}$. The number of adders 9, 10, 11 is n−1 in this case and in the other examples of embodiment. If n=1, only one multiplier and no adder is necessary.

In the example of embodiment shown in FIG. 4 it is assumed that n=2, thus the filter coefficients are limited to two "1" bits. Accordingly, only two multipliers 5, 6 and one adder 10 are necessary.

In the example of embodiment shown in FIG. 5 the adder stage 3 comprises a programmable selector 12. Due to the programmable structure the filter coefficients need not of necessity be determined prior to the implementation of the filter. Rather a general programmable filter can be implemented with the selectors, the filter coefficients of which have a maximum of n "1" bits. It is again assumed here that n=4 (compare FIG. 8), so three adders 9, 10, 11 are necessary. By means of the programmable selector 12 its outputs $X_i$, $X_k$, $X_l$, $X_m$ are selected accordingly. The range of values of the inputs i, k, l and m is situated between 0 and M−1 and connects one of the respective inputs $X_0 \ldots X_{M-1}$ with one of the outputs. The output $X_i$ is determined by i, $x_m$ is determined by m and so on. For example, a programming of the inputs with i=1, k=3, l=4 and m=5 selects the outputs at $X_i=X_1$, $X_k=X_3$, $X_l=X_4$ and $X_m=X_5$. M in this example is 8 (compare FIG. 7, FIG. 8).

FIG. 13 shows one of the squaring multipliers 5, 6, 7, 8. This multiplier is formed by a simple connection of the data lines between the 8-bit input and the 8-bit output. FIG. 13 shows the connection for the case of the shift by one position. In the other cases mentioned a respective other connection is selected.

FIG. 8 represents the quantity response which appears in a filter having filter coefficients selected in the above way in unbroken lines, where n=4. The comparison of the solid line with the dashed line shows that there is no considerable deviation as a result of said selection of filter coefficients.

FIG. 10 represents the quantity response with filter coefficients with n=3 in solid lines. The comparison shows that from about 4 MHz there are slight deviations. Accordingly, FIG. 11 represents the quantity response for filter coefficients with n=2. Here too there are certain deviations only starting from 3.5 MHz.

FIG. 12 shows the curve of the quantization error E(s) described above with scaling factors in the range from 1.6 to 2.1. The quantization error shows a minimum at about 1.97. This value is accordingly used as the scaling factor $s_0$.

In all examples of embodiment the quantization and optimization of the scaling factor has achieved that instead of costly multipliers (FIG. 1), simple adder stages 3 can be used which reduces the required chip area of the hardware. The multipliers 5 to 8 of the adder stage 3 can be manufactured in a considerably simpler fashion, contrary to the multipliers of FIG. 1. Since fewer arithmetic operations are necessary than in the state of the art, also the power consumption is reduced. The distortions of the signal are slight and depend on the selection of the number n. The processing rate is increased if the additions in all adder stages 3 are carried out simultaneously and by equally many adders.

When the proposed quantization is used in a UMTS Root-Raised Cosine Filter, it is possible in a filter with symmetrical coefficients of length 32 to replace the 16 12-bit multipliers 1 with 16 12-bit adder stages 3.

The invention claimed is:

1. A method, comprising:
   determining a plurality of filter coefficients for a digital filter for a Universal Mobile Telecommunication System (UMTS), the determining including:
      dividing initial filter coefficient by a scaling factor, to result in a plurality of scaled filter coefficients:
      quantizing the scaled filter coefficient so that only a certain maximum number (n) of "1" bits are counted from a most significant bit onwards:
      determining a respective quantization error of each quantized scaled filter coefficient relative to a respective one of the initial filter coefficients; and
      repeatedly modifying for a number of times the scaling factor and determining which scaling factor results in a quantization error having minimal error value, and
   implementing in the filter the filter coefficients resulting in the minimal error value.

2. A method as claimed in claim 1, wherein the number (n) comprises one of four, three, or two.

3. A method as claimed in claim 1, wherein if again a "1" bit follows the last "1" bit, a rounding is effected from the last bit onwards.

4. The new method according to claim 1, further comprising multiplying an input by $2^j$ by shifting the input by i and summing shifted values using a plurality of adders.

5. The method according to claim 4, wherein the multiplying is performed using a plurality of multipliers, the method further comprising selectively connecting the multipliers with the adders using a programmable selector in accordance with a programming.

6. The method according to claim 1, further comprising:
   multiplying an input by $2^j$ by shifting the input by i using a multiplier formed by connections of inputs and outputs.

7. A digital filter for a Universal Mobile Telecommunication System (UMTS), comprising
   means for dividing a plurality of binary filter coefficients by a scaling factor to result in a plurality of scaled filter coefficients;
   means for quantizing the scaled filter coefficients so that they do not exceed a selected number (n) of "1" bits from a most significant bit onwards; and
   adder stages for processing the scaled and quantized filter coefficients with an input signal.

8. The digital filter as claimed in claim 7, comprising a final stage for processing an output signal by a factor reciprocal to the scaling factor.

9. A digital filter as claimed in claim 7, wherein each adder stage comprises n−1 adders and means for multiplying an input by $2^i$ by shifting the input by i, the input being a respective one of the scaled and quantized filter coefficients.

10. A digital filter as claimed in claim 7, wherein the adder stages include first and second adder stages respectively including:
    respective numbers of multiplying means for multiplying an input by $2^i$ by shifting the input by i, wherein the respective numbers of multiplying means are different: and
    respective numbers of adders coupled to the respective multiplying means, wherein the respective numbers of adders are different.

11. A digital filter as claimed 10, wherein the adder stages include a third adder stage having only a single multiplying means for multiplying an input by $2^j$ by shifting the input by i.

12. A digital filter as claimed in claim 7, wherein each adder stage comprises n-1 adders and means for multiplying an input by $2^j$ by shifting the input by i, the input being a respective one of the scaled and quantized filter coefficients, wherein each of the means for multiplying the input by $2^i$ by shifting the input by i is formed by connections of inputs and outputs of a multiplier stage.

13. A digital filter as claimed in claim 7, wherein each adder stage comprises:
    n-1 adders;
    multiplying means for multiplying an input by $2^j$ by shifting the input by j, the input being a respective one of the scaled and quantized filter coefficients; and
    a programmable selector which in accordance with programming connects the multiplying means with the adders.

14. A method, comprising:
    producing a plurality of scaled filter coefficients by dividing initial filter coefficients by a scaling factor;
    quantizing the scaled filter coefficients so that only a certain maximum number (n) of "1" bits are counted from a most significant bit onwards;
    determining respective quantization errors of the quantized scaled filter coefficients relative to the initial filter coefficients, respectively; and
    modifying the scaling factor and determining which scaling factor results in a quantization error having minimal error value, and
    implementing in the filter the filter coefficients resulting in the minimal error value.

15. A method as claimed in claim 14, wherein the number (n) comprises one of four, three, or two.

16. A method as claimed in claim 14, wherein if again a "1" bit follows the last "1" bit, a rounding is effected from the last bit onwards.

17. The method according to claim 14, further comprising:
    multiplying an input by $2^j$ by shifting the input by i using a multiplier formed by connections of inputs and outputs.

18. The method according to claim 14, further comprising multiplying an input by $2^j$ by shifting the input by i and summing shifted values using a plurality of adders.

19. The method according to claim 18, wherein the multiplying is performed using a plurality of multipliers, the method further comprising selectively connecting the multipliers with the adders using a programmable selector in accordance with a programming.

* * * * *